(12) United States Patent
Reinmuth

(10) Patent No.: US 9,136,169 B2
(45) Date of Patent: Sep. 15, 2015

(54) METHOD FOR PRODUCING AN ELECTRICAL FEEDTHROUGH IN A SUBSTRATE, AND SUBSTRATE HAVING AN ELECTRICAL FEEDTHROUGH

(75) Inventor: Jochen Reinmuth, Reutlingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 479 days.

(21) Appl. No.: 13/195,470

(22) Filed: Aug. 1, 2011

(65) Prior Publication Data
US 2012/0037412 A1  Feb. 16, 2012

(30) Foreign Application Priority Data
Aug. 13, 2010 (DE) .......................... 10 2010 039 330

(51) Int. Cl.
| | | |
|---|---|---|
| H01K 3/10 | (2006.01) |
| H01L 21/768 | (2006.01) |
| B81B 3/00 | (2006.01) |
| G01L 9/00 | (2006.01) |
| G01L 19/00 | (2006.01) |
| H01L 23/48 | (2006.01) |

(52) U.S. Cl.
CPC ........ H01L 21/76898 (2013.01); B81B 3/0086 (2013.01); G01L 9/0042 (2013.01); G01L 19/0076 (2013.01); H01L 23/481 (2013.01); B81B 2201/0264 (2013.01); B81B 2207/096 (2013.01); H01L 21/7682 (2013.01); H01L 2924/0002 (2013.01); Y10T 29/49165 (2015.01)

(58) Field of Classification Search
CPC ..................... B81B 3/0086; B81B 2201/0264; B81B 2207/096; G01L 9/0042; G01L 19/0076; H01L 23/481; H01L 21/76898; H01L 21/7682; H01L 2924/0002; H01L 2924/00; Y10T 29/49165; Y10T 29/49155; Y10T 29/49124; Y10T 29/49117; Y10T 29/49002
USPC ......... 29/852, 846, 829, 825, 592.1; 174/262, 174/260, 261, 250, 68.1
See application file for complete search history.

(56) References Cited

U.S. PATENT DOCUMENTS

2007/0143994 A1* 6/2007 Primavera et al. .............. 29/852
2008/0006850 A1* 1/2008 Ribnicek et al. .............. 257/213

FOREIGN PATENT DOCUMENTS

| CN | 1671273 A | 9/2005 |
|---|---|---|
| DE | 10309854 A1 | 10/2003 |
| DE | 10 2006 018027 | 10/2007 |
| DE | 10 2006 042366 | 3/2008 |

* cited by examiner

*Primary Examiner* — A. Dexter Tugbang
*Assistant Examiner* — Azm Parvez
(74) *Attorney, Agent, or Firm* — Kenyon & Kenyon LLP

(57) ABSTRACT

A method is described for producing an electrical feedthrough in a substrate, and a substrate having an electrical feedthrough. The method has the following operations of forming the electrical feedthrough so that it extends through the substrate from the front side to the back side of the substrate, forming a first closing layer on a front side of the substrate, forming an annular isolation trench in the substrate which encloses the electrical feedthrough, using an etching process starting from the back side of the substrate, the etching process terminating at the first closing layer, and closing off the annular isolation trench in the substrate by forming a second closing layer on the back side of the substrate.

16 Claims, 15 Drawing Sheets

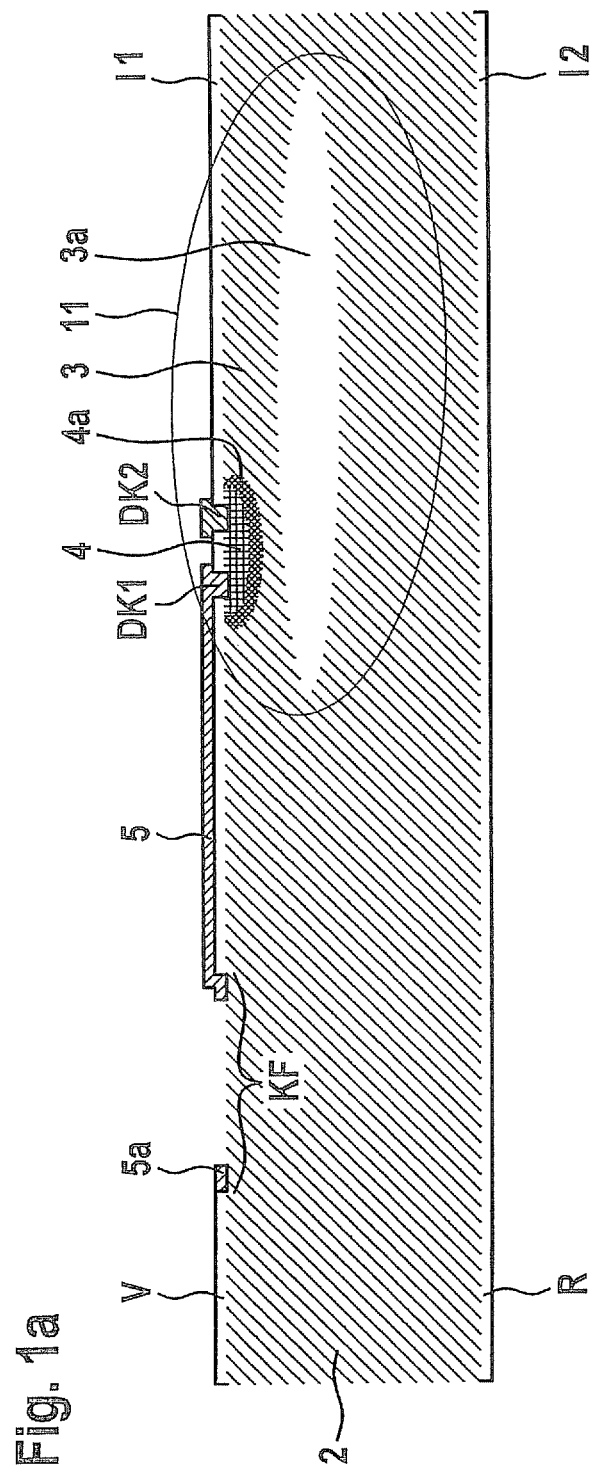

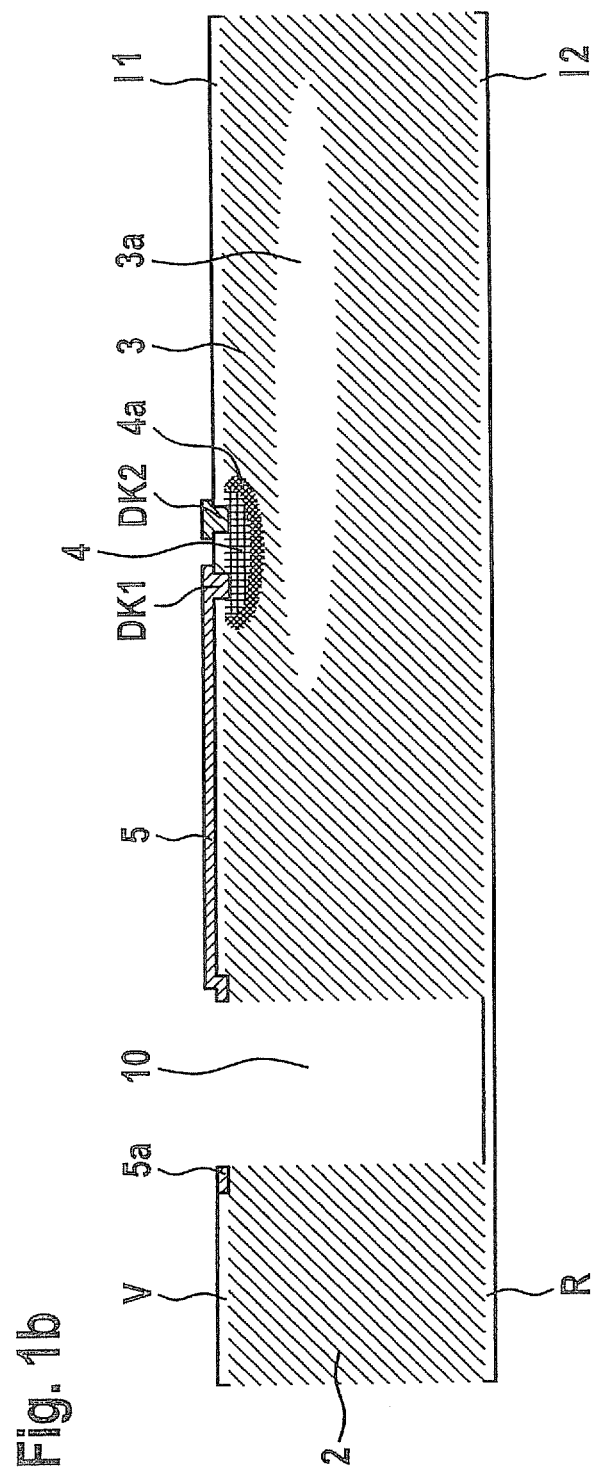

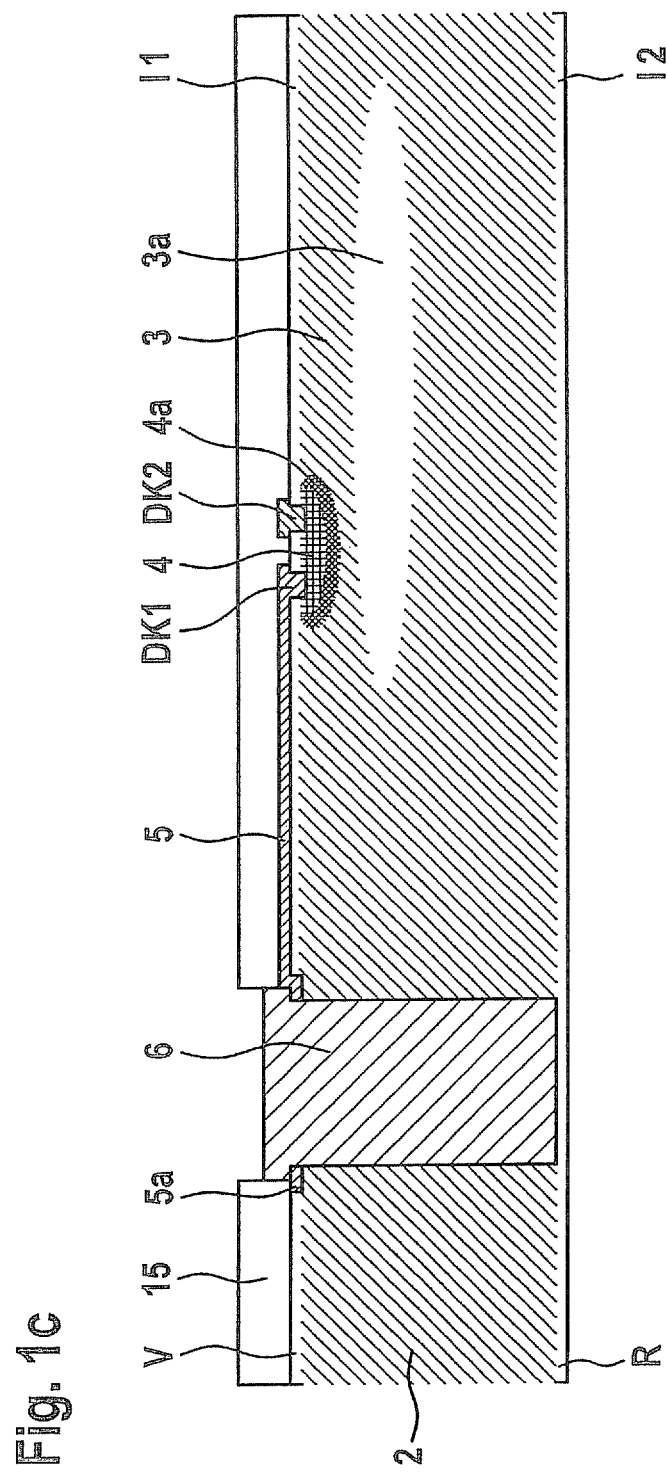

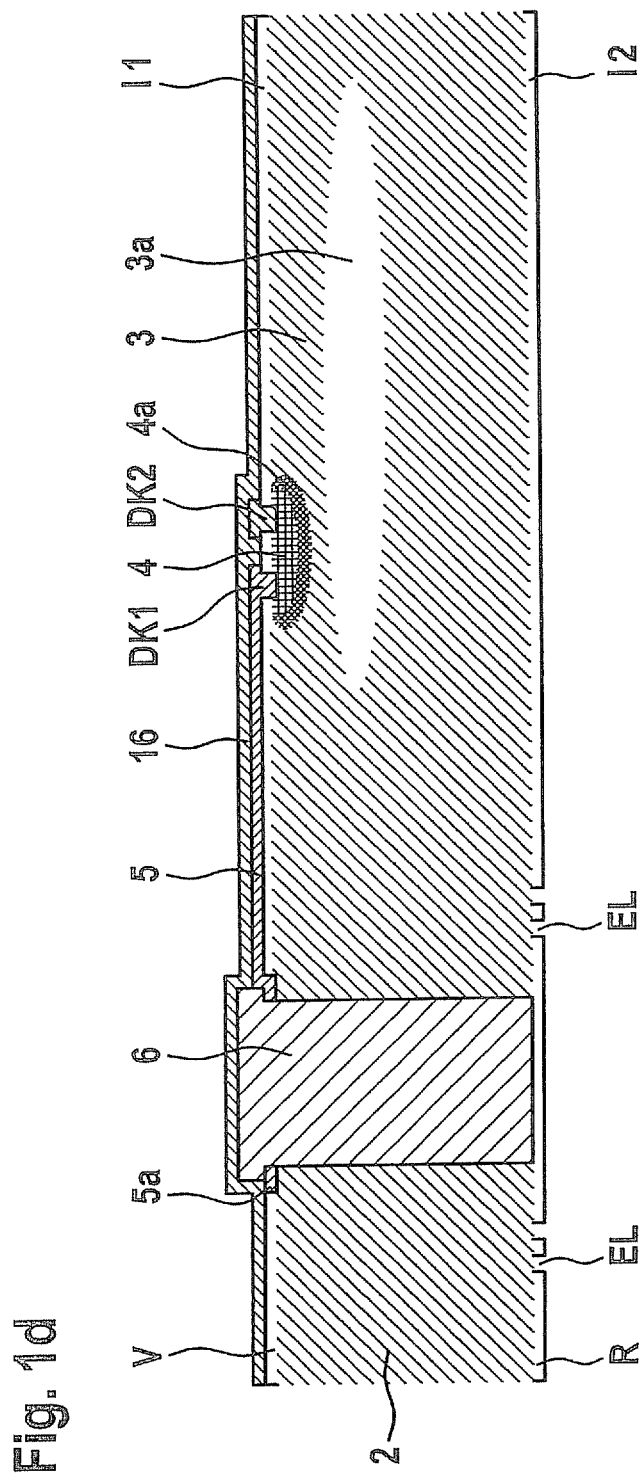

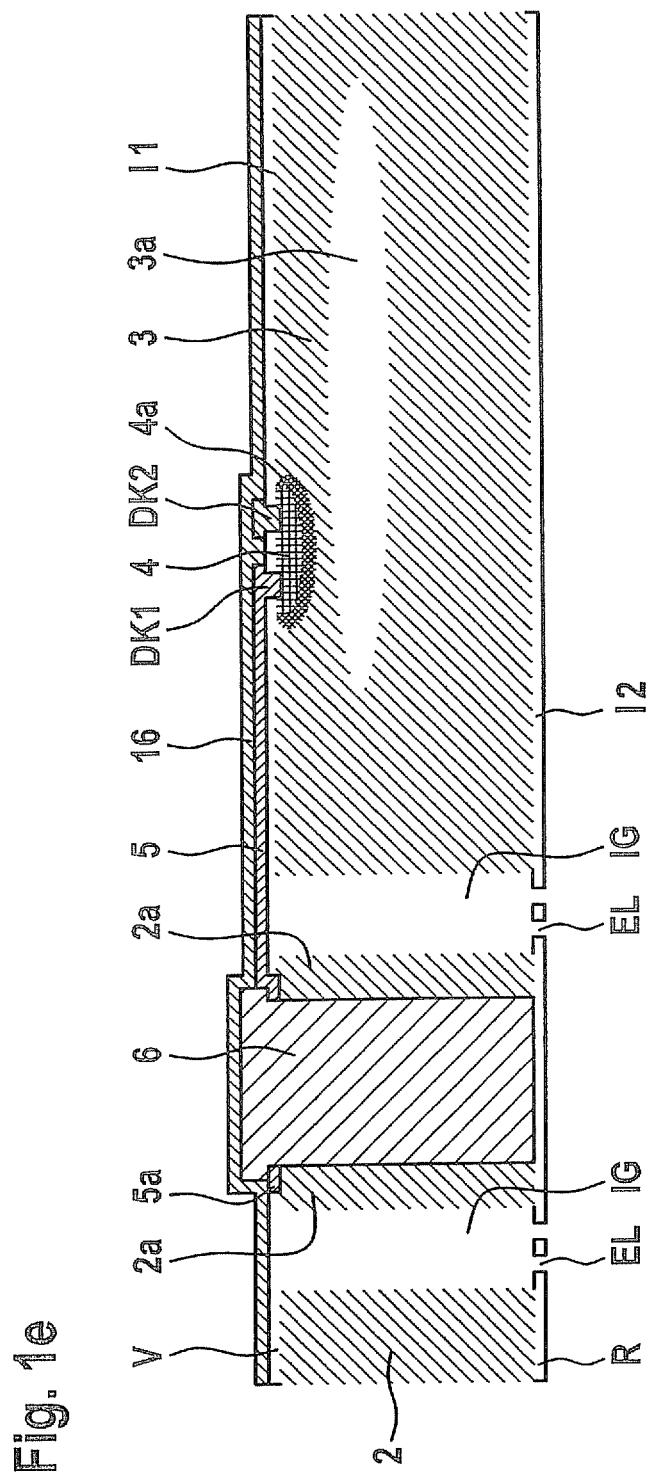

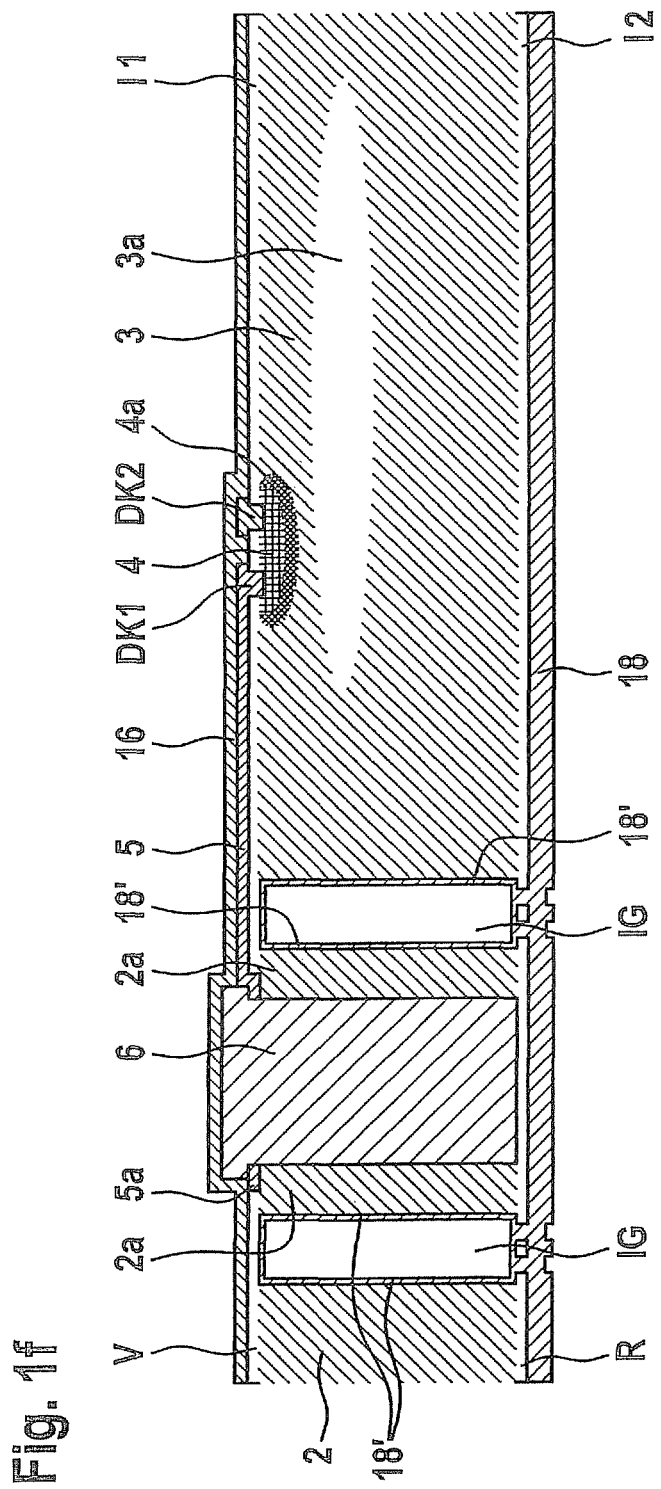

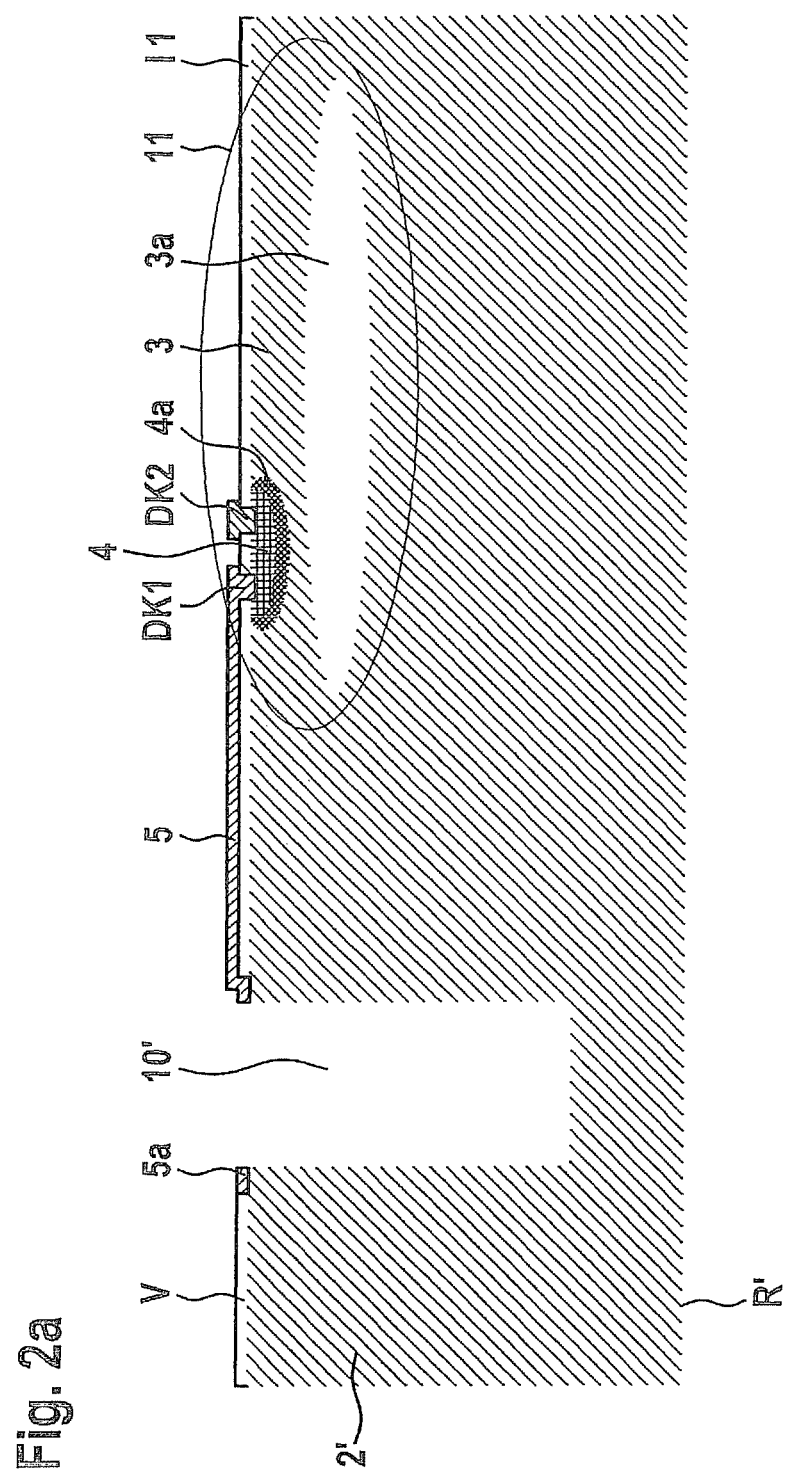

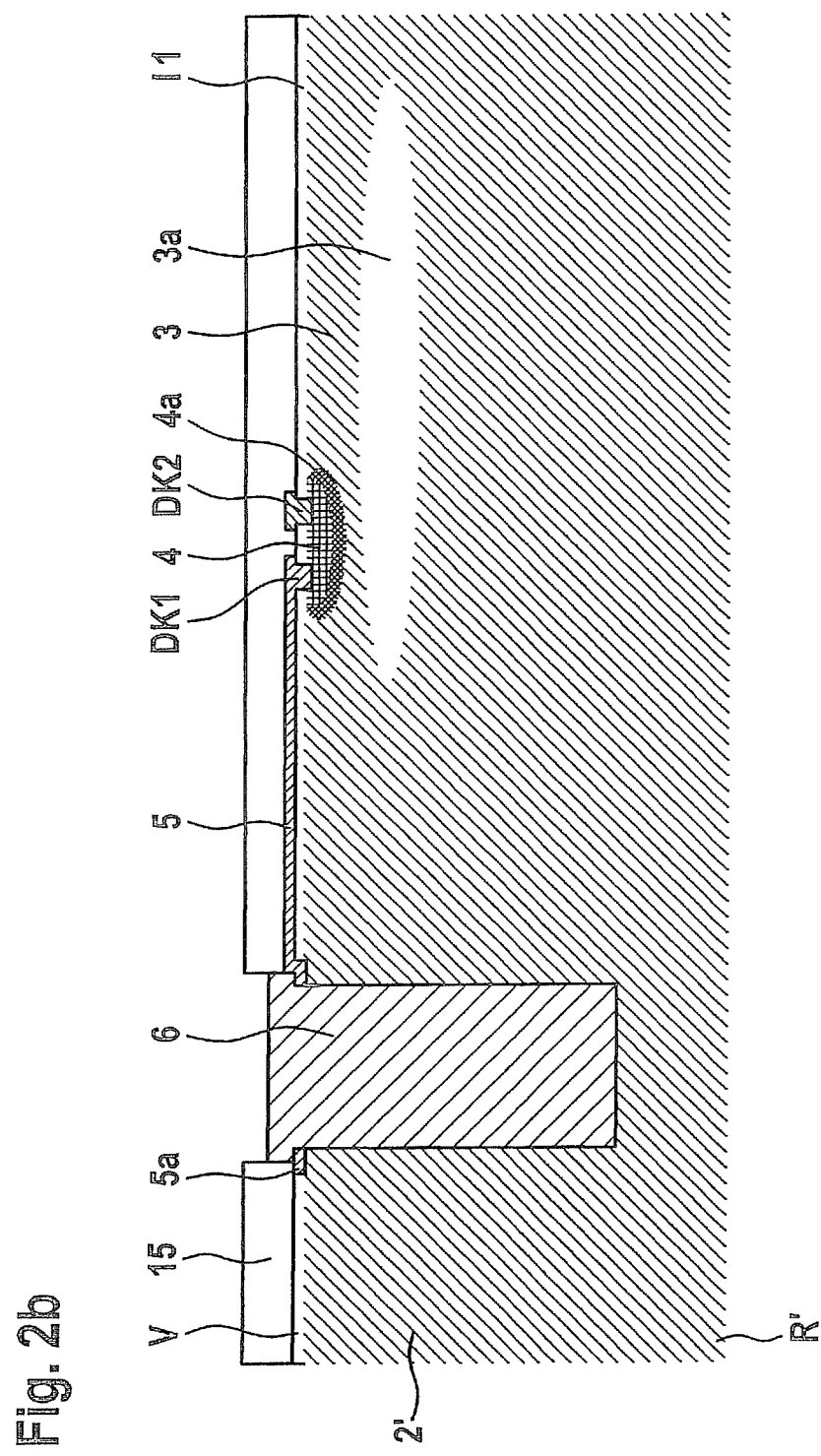

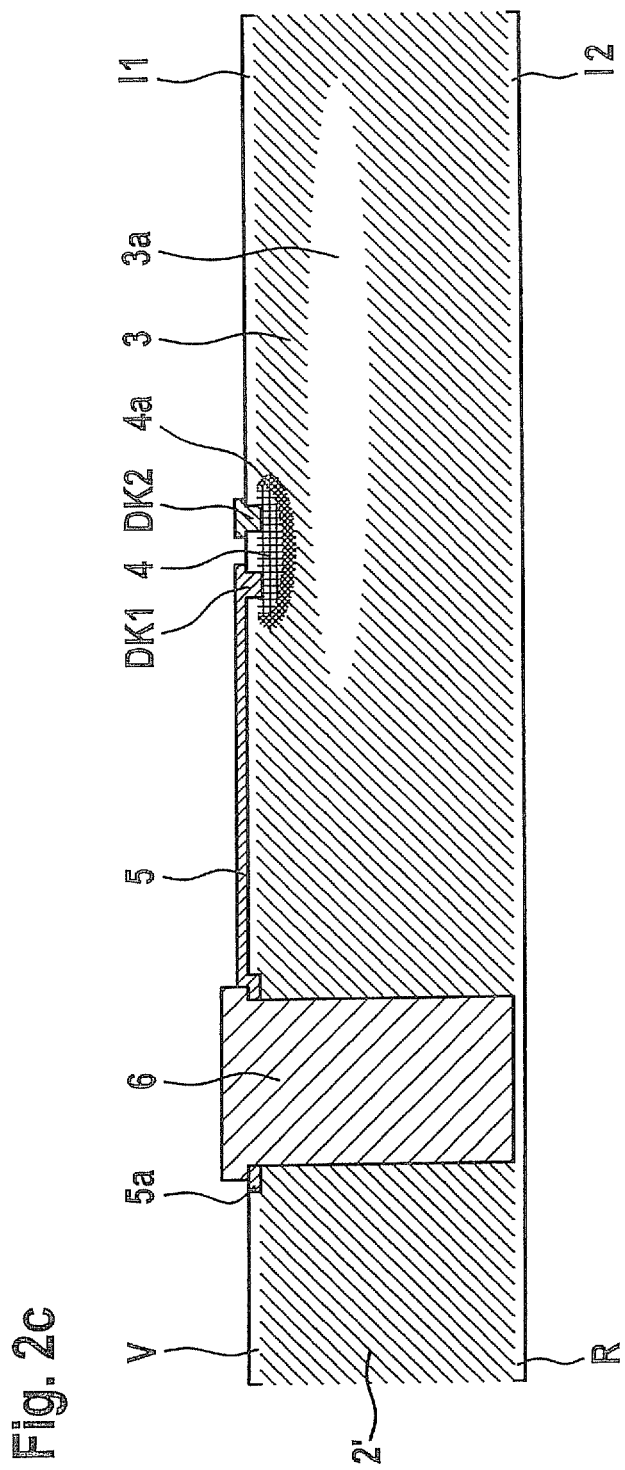

METHOD FOR PRODUCING AN ELECTRICAL FEEDTHROUGH IN A SUBSTRATE, AND SUBSTRATE HAVING AN ELECTRICAL FEEDTHROUGH

RELATED APPLICATION INFORMATION

The present application claims priority to and the benefit of German patent application no. 10 2010 039 330.4, which was filed in Germany on Aug. 13, 2010, the disclosure of which is incorporated herein by reference.

FIELD OF THE INVENTION

The present invention relates to a method for producing an electrical feedthrough in a substrate, and a substrate having an electrical feedthrough.

BACKGROUND INFORMATION

Electrical feedthroughs in a substrate or in a subregion of a substrate, such as a wafer, for example, exist in numerous specific embodiments. The objective is always to achieve the smallest possible feedthrough at a low electrical volume resistance. To achieve this, frequently a narrow through hole having practically vertical walls is produced in the substrate in question, the wall is electrically insulated, and the through hole is then completely or partially filled with a metal or a metal alloy in order to obtain the desired low volume resistance.

Depending on the application, this known approach has limitations. On the one hand, there are applications in which the presence of metal results in interference. The micromechanical pressure sensor is named here as one example of numerous MEMS applications.

FIG. 7 shows a schematic cross-sectional illustration for explaining the object on which the exemplary embodiments and/or exemplary methods of the present invention are based, with reference to a substrate having an electrical feedthrough and a pressure sensor as an example.

In FIG. 7, reference numeral 2 denotes a silicon semiconductor substrate. A first region 1 having an electrical feedthrough 6a and a second region 11 having a micromechanical component in the form of a pressure sensor are provided in silicon semiconductor substrate 2. Feedthrough 6a is connected to a first electrical contact terminal DK1 of pressure sensor 11 via a printed conductor 15a on front side V of substrate 2. Pressure sensor 11 has a diaphragm 3 which is provided above a cavity 3a. A piezoresistive resistor 4 and an isolation well 4a situated therebeneath are diffused into diaphragm 3. First electrical contact terminal DK1 as well as a second electrical contact terminal DK2 contact piezoresistive resistor 4 in such a way that the piezoelectric resistance therebetween is detectable.

A first insulating layer I1 is provided between electrical metal printed conductor 15a and front side V of substrate 2. A second insulating layer I2 is provided between an electrical metal printed conductor 15b on the back side, and back side R of substrate 2. Insulating layers I1 and I2 may be oxide layers, for example. Feedthrough 6a connects printed conductor 15a on the front side to printed conductor 15b on the back side. A wall insulating layer 7a, which is likewise made of oxide, for example, insulates feedthrough 6a from surrounding substrate 2. Lastly, reference numeral 9 denotes a so-called seed layer for applying the metal of feedthrough 6a, which at the same time may be used as a diffusion barrier.

In such classical micromechanical pressure sensors 11, deformation of silicon diaphragm 3, which is situated on silicon substrate 2, is measured via the piezoresistive resistor. The deformation of diaphragm 3, and thus the resistance signal of piezoresistive resistor 4, changes when the pressure changes. As a result of the different material parameters of silicon and metal, narrow metal printed conductors 15a located at the surface and in the vicinity of diaphragm 3 result in voltages which are transmitted via substrate 2 to diaphragm 3. The temperature-dependent portion of the voltages may be compensated for, with some effort. However, the inelastic properties of many metals also result in hysteresis in the characteristic curve of the pressure sensor. It is not possible to compensate for this effect. When metallic regions are provided not only at the surface but also at a depth in substrate 2, even greater adverse effects on voltage-sensitive components, for example such as pressure sensors, are expected.

On the other hand, there are a number of applications in which primarily also high voltages or also only high voltage peaks (ESD, for example) are to be conducted by a substrate or a subregion of the substrate via an electrical feedthrough. This is difficult using the approach described above. The etched through holes are usually insulated by oxide deposition. The achievable oxide thicknesses are greatly limited by the process control and the specific geometry. Therefore, the maximum dielectric strength is also greatly limited. In addition, the surface of the through holes, which are produced using a trench etching process or a laser process, is rather rough. This roughness causes electrical field peaks which likewise reduce the dielectric strength.

Alternative approaches without metals are not feasible in many applications, since the extremely low volume resistances which are often necessary are achievable only using metals.

A micromechanical component having wafer through-contacting as well as a corresponding manufacturing method are discussed in German patent document DE 10 2006 018 027 A1. A blind hole is introduced into the front side of a semiconductor substrate using a trench etching process, and the side wall of the blind hole is porously etched using an electrochemical etching process. The blind hole is filled with a metal plating and subsequently opened by thinning the semiconductor substrate on the back side.

A micromechanical component having wafer through-contacting as well as a corresponding manufacturing method are discussed in German patent document DE 10 2006 042 366 A1, in which metallic material is initially applied to a first region on the surface of the top side of a semiconductor substrate. The first region is designed in such a way that it leaves open a second region on the top side of the semiconductor substrate, which does not have the metallic material, and completely encloses this second region. A thermal step is then carried out which produces a first volume region within the semiconductor substrate having P+ or P++ doping. The thermal step results in a diffusion process in which metallic material diffuses from the top side to the bottom side of the semiconductor substrate. As a result of the diffusion process, the first volume region thus produced encloses a second volume region, which may be composed of the unaffected P-doped semiconductor material. To provide electrical insulation between the second volume region and the P-doped semiconductor material enclosing the first volume region, the first volume region is porosified using a suitable etching process.

SUMMARY OF THE INVENTION

The present invention provides a method for producing an electrical feedthrough in a substrate having the features described herein, and a substrate having an electrical feedthrough having the features further described herein.

A concept on which the exemplary embodiments and/or exemplary methods of the present invention is based is that, for a substrate having an electrical feedthrough, an annular isolation trench which encloses the electrical feedthrough is provided in the substrate. The annular isolation trench is closed off by a first closing layer on the front side of the substrate and by a second closing layer on the back side of the substrate.

The subject matter of the exemplary embodiments and/or exemplary methods of the present invention allows production of metallic feedthroughs through a substrate, a high dielectric strength and stress decoupling between the metal-plated region and the substrate being possible.

The type of feedthrough according to the exemplary embodiments and/or exemplary methods of the present invention has low leakage currents, low parasitic capacitances, low volume resistance, and high mechanical robustness. Incomplete filling of the holes with metal does not result in failures. Lateral cracks in the metal likewise do not result in failures. The process is compatible with highly doped substrates, and the process control is simple and robust.

Another advantage of the feedthrough according to the present invention is that in principle, previously necessary diffusion barriers and/or seed layers may be dispensed with. Any desired dielectric strength may be achieved, depending on the geometry of the isolation trench. In particular, the isolation trench is used for mechanical decoupling between the metallic feedthrough and the surrounding substrate.

Refinements are the subject matter of the respective descriptions herein.

Further features and advantages of the exemplary embodiments and/or exemplary methods of the present invention are explained below based on specific embodiments, with reference to the figures.

BRIEF DESCRIPTION OF THE DRAWINGS

FIGS. 1a, 1b, 1c, 1d, 1e, 1f, and 1g show schematic cross-sectional illustrations for explaining various process stages of a method for producing an electrical feedthrough in a substrate according to a first specific embodiment of the present invention.

FIGS. 2a, 2b, and 2c show schematic cross-sectional illustrations for explaining various process stages of a method for producing an electrical feedthrough in a substrate according to a second specific embodiment of the present invention.

DETAILED DESCRIPTION

Figure 1G:
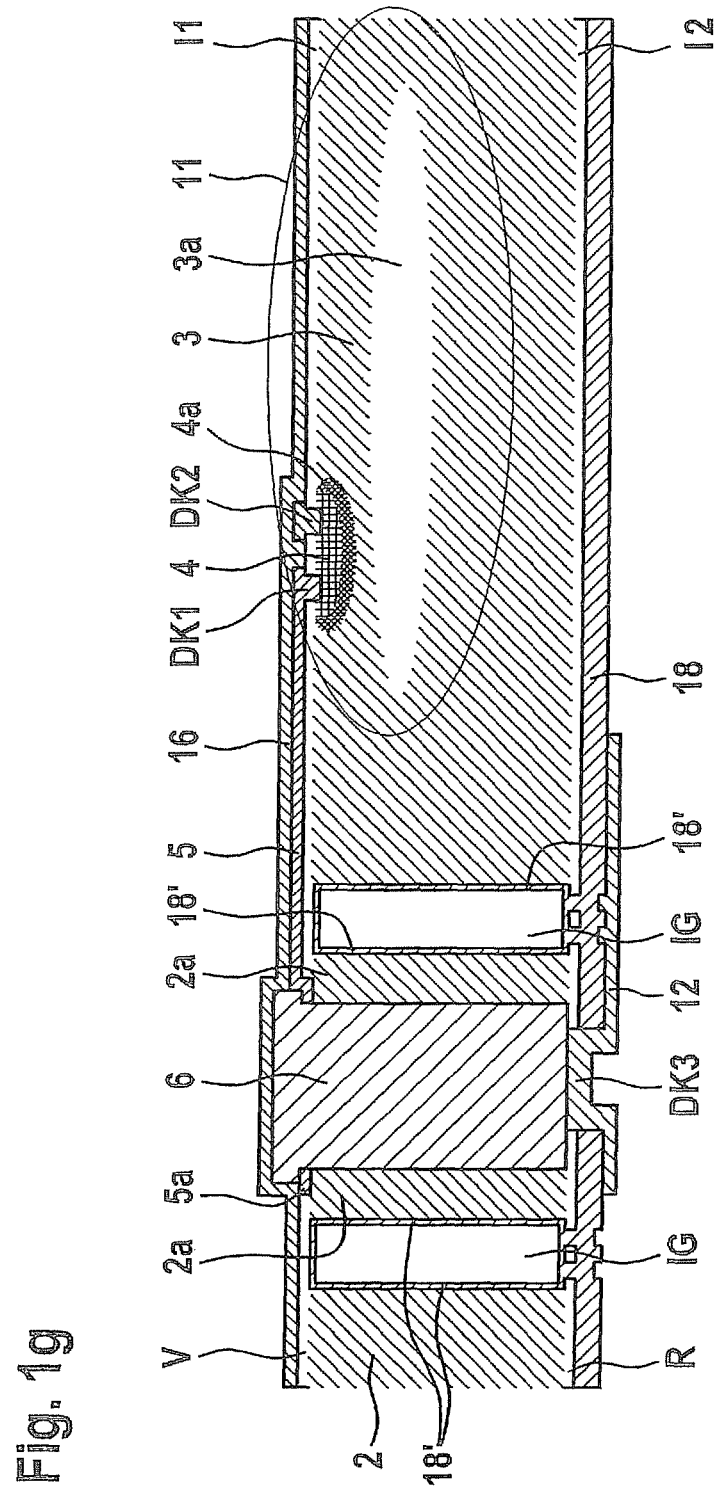

Identical or functionally equivalent components are denoted by the same reference numerals in the figures.

FIGS. 1a through 1g show schematic cross-sectional illustrations for explaining various process stages of a method for producing an electrical feedthrough in a substrate according to a first specific embodiment of the present invention.

Figure 7:
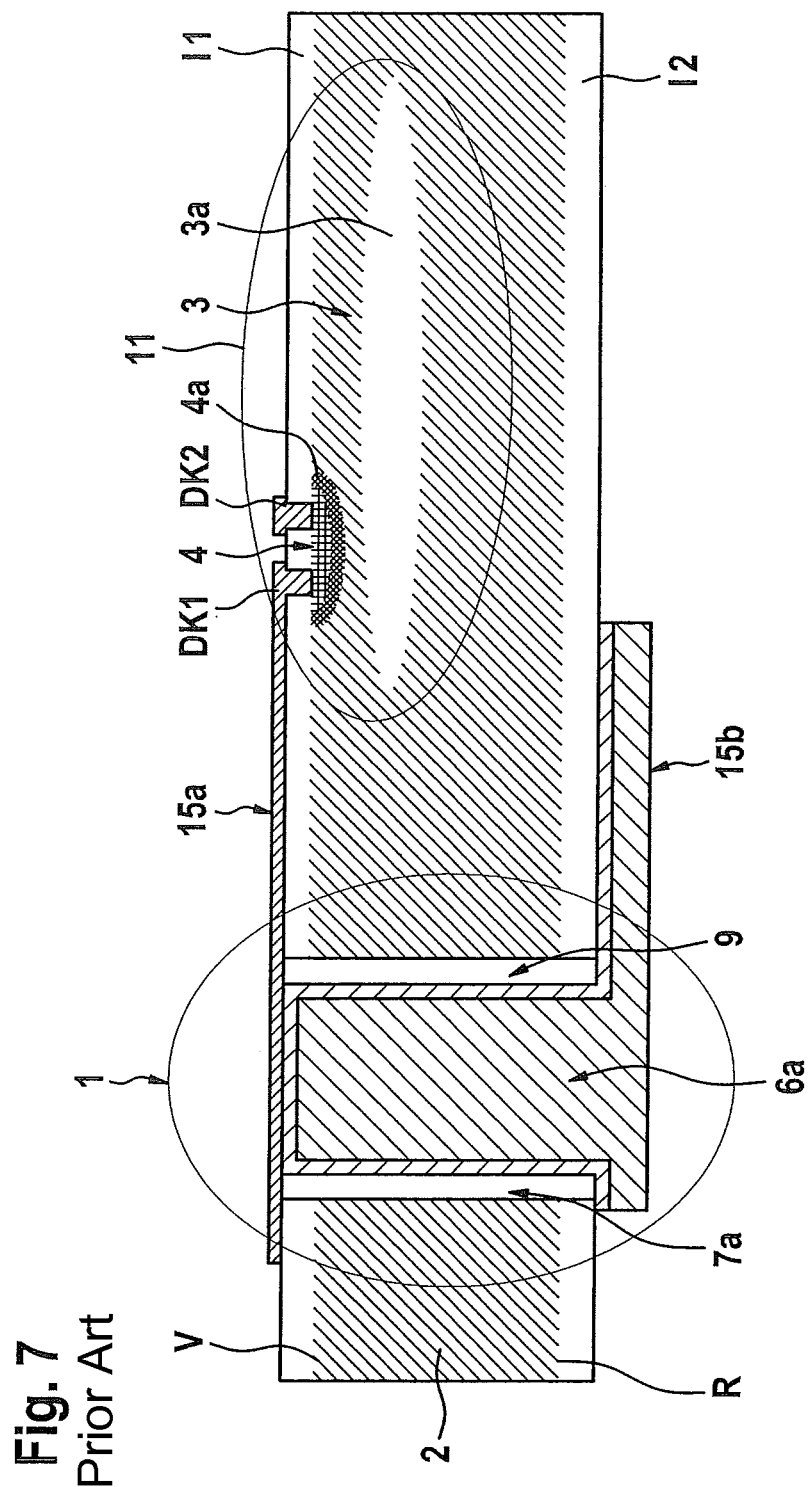
FIG. 7 shows a schematic cross-sectional illustration for explaining the object on which the present invention is based, with reference to a substrate having an electrical feedthrough and a pressure sensor as an example.

According to FIG. 1a, a micromechanical component 11 in the form of a pressure sensor, which has already been explained in detail with reference to FIG. 7, is provided in a silicon semiconductor substrate 2.

After forming a first insulating layer I1 on front side V of substrate 2 and forming a second insulating layer I2 on back side R of substrate 2, through holes corresponding to electrical contact terminals DK1, DK2 for piezoresistive resistor 4 as well as a through hole KF are initially formed in first insulating layer I1, through hole KF corresponding to a contacting region of a feedthrough through substrate 2 which is to be subsequently produced.

Electrical contact terminals DK1, DK2 of piezoresistive resistor 4, a metallic contact ring 5a in through hole KF, and a metallic printed conductor 5 which connects contact ring 5a to electrical contact terminal DK1 are subsequently formed by deposition and appropriate structuring of a metal layer.

In a subsequent process step which is illustrated in FIG. 1b, a through hole 10 is formed in substrate 2 using an etching process, starting from front side V of substrate 2, the etching process terminating at insulating layer I2 on the back side which, for example, the same as first insulating layer I1, is an oxide layer. This etching process may be carried out in a self-adjusting manner, first insulating layer I1 and contact ring 5a being used as an etching mask.

In addition, with reference to FIG. 1c, through hole 10 is filled with metal to form an electrical feedthrough 6 therein, which extends above contact ring 5a and partially covers same at the top in the manner of a shoulder. For example, the metal of electrical feedthrough 6 may be provided by electrochemical deposition, it being advantageously possible to apply the electrical potential required for the deposition via substrate 2. The exact shape of electrical feedthrough 6 may be specified via a mask made of protective lacquer 15 on first insulating layer I1 and printed conductor 5, electrical contact terminals DK1, DK2, and a portion of contact ring 5a.

As illustrated in FIG. 1d, in a subsequent process step, a dielectric protective layer 16, made of nitride, for example, and which may cover entire front side V, is provided over front side V of substrate 2, thus making this side particularly robust with respect to environmental influences and influences from subsequent process steps.

Etching holes EL are then formed on the back side in second insulating layer I2 in regions where annular isolation trenches IG (see FIG. 1e) which enclose electrical feedthrough 6 are to be formed in a subsequent process step. In the subsequent process, second insulating layer I2, which was previously used as an etching stop layer during etching of through hole 10, may thus be used as an insulating layer and at the same time as a mask for etching the annular isolation trench, thus increasing process efficiency.

As illustrated in FIG. 1e, an annular isolation trench IG which completely encloses electrical feedthrough 6 and an annular substrate region 2a is subsequently formed in substrate 2, annular substrate region 2a which is left directly adjoining electrical feedthrough 6 and being electrically connected thereto since it is in direct contact with electrical feedthrough 6. Annular isolation trench IG is advantageously formed using a trench etching process, starting from back side R of the substrate, in such a way that the etching process terminates at first insulating layer I1. Thus, first insulating layer I1 also carries out multiple functions, i.e., in addition to the insulation function, a closure function on the front side for annular isolation trench IG, and an etching stop function during formation of annular isolation trench IG.

In a further process step as shown in FIG. 1f, annular isolation trench IG is closed off by applying a further insulating layer 18 as a closing layer on back side R of the substrate. An oxide layer, for example, may be present on this insulating layer 18. Etching holes EL of second insulating layer I2 are closed off by third insulating layer 18, a thin linear insulating liner layer 18' also being formed on the walls of annular isolation trench IG.

Thus, annular isolation trench IG is closed off by first insulating layer I1 and third insulating layer 18. In this regard, it is noted that when annular isolation trench IG has a small width, second insulating layer I2 could be dispensed with entirely or could be removed before depositing third insulating layer 18. Layers I1 and 18 form the closure for annular isolation trench IG, annular isolation trench IG being left unfilled in the region between layers I1 and 18, thus allowing appropriate mechanical decoupling to be achieved.

Lastly, with reference to FIG. 1g a third electrical contact terminal DK3 for electrical feedthrough 6 is formed on back side R of substrate 2, and is adjoined by a further metallic printed conductor 12, via back side R of substrate 2, which is insulated with respect to substrate 2 via layers 18 and I2.

As is apparent from FIG. 1g, electrical feedthrough 6, made of metal, is electrically connected in parallel to substrate region 2a which is left, and which is in direct contact with electrical feedthrough 6 and with contact ring 5a.

FIGS. 2a through 2c show schematic cross-sectional illustrations for explaining various process stages of a method for producing an electrical feedthrough in a substrate according to a second specific embodiment of the present invention.

In the second specific embodiment, according to FIG. 2a a fairly thick silicon semiconductor substrate 2' is used which initially has a front side V and a back side R'. The process state according to FIG. 2a essentially corresponds to the process state according to FIG. 1b, except that according to FIG. 2a, instead of through hole 10 a blind hole 10' is provided which terminates in front of back side R' of substrate 2'. In addition, according to FIG. 2a no second insulating layer I2 is initially provided on the back side.

As illustrated in FIG. 2b, electrical feedthrough 6 is subsequently formed in blind hole 10' with the aid of the mask made of protective lacquer 15. The same as in the first specific embodiment, electrical feedthrough 6, made of metal, lies on contact ring 5a in the manner of a shoulder.

In addition, with reference to FIG. 2c, substrate 2' is subsequently thinned on the back side, using a grinding process, for example, until electrical feedthrough 6 is exposed on new back side R. Second insulating layer I2 is subsequently provided on the back side.

Based on FIG. 2c, the process state according to FIG. 1d is achieved after removing protective lacquer 15 and applying protective layer 16, made of an insulating material, on the front side, and introducing etching holes EL into second insulating layer I2.

To avoid repetition, the additional process steps starting at FIG. 1d until reaching the process state according to FIG. 1g are not described again.

Figure 3:
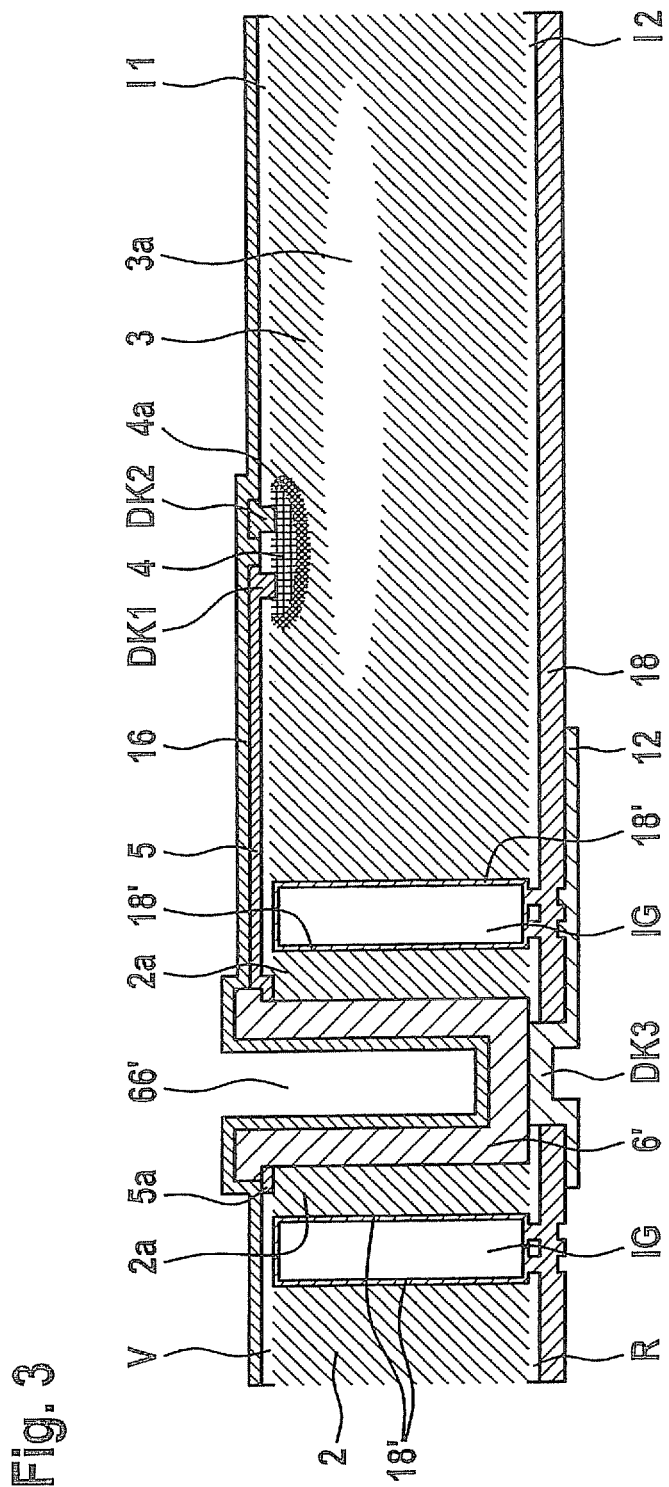
FIG. 3 shows a schematic cross-sectional illustration of a substrate having an electrical feedthrough according to a third specific embodiment of the present invention.

FIG. 3 shows a schematic cross-sectional illustration of a substrate having an electrical feedthrough according to a third specific embodiment of the present invention.

In the third specific embodiment according to FIG. 3, an electrical feedthrough 6' made of metal and having a cavity 66' is provided. In this exemplary embodiment, protective layer 16 on the front side extends to the interior of cavity 66' and thus covers the entire top side of electrical feedthrough 6'.

Depending on the application, it may also be advantageous to fill cavity 66' with a filler, for example PCB or molding compound, among others.

Otherwise, the third specific embodiment is identical to the first specific embodiment described above.

Figure 4:
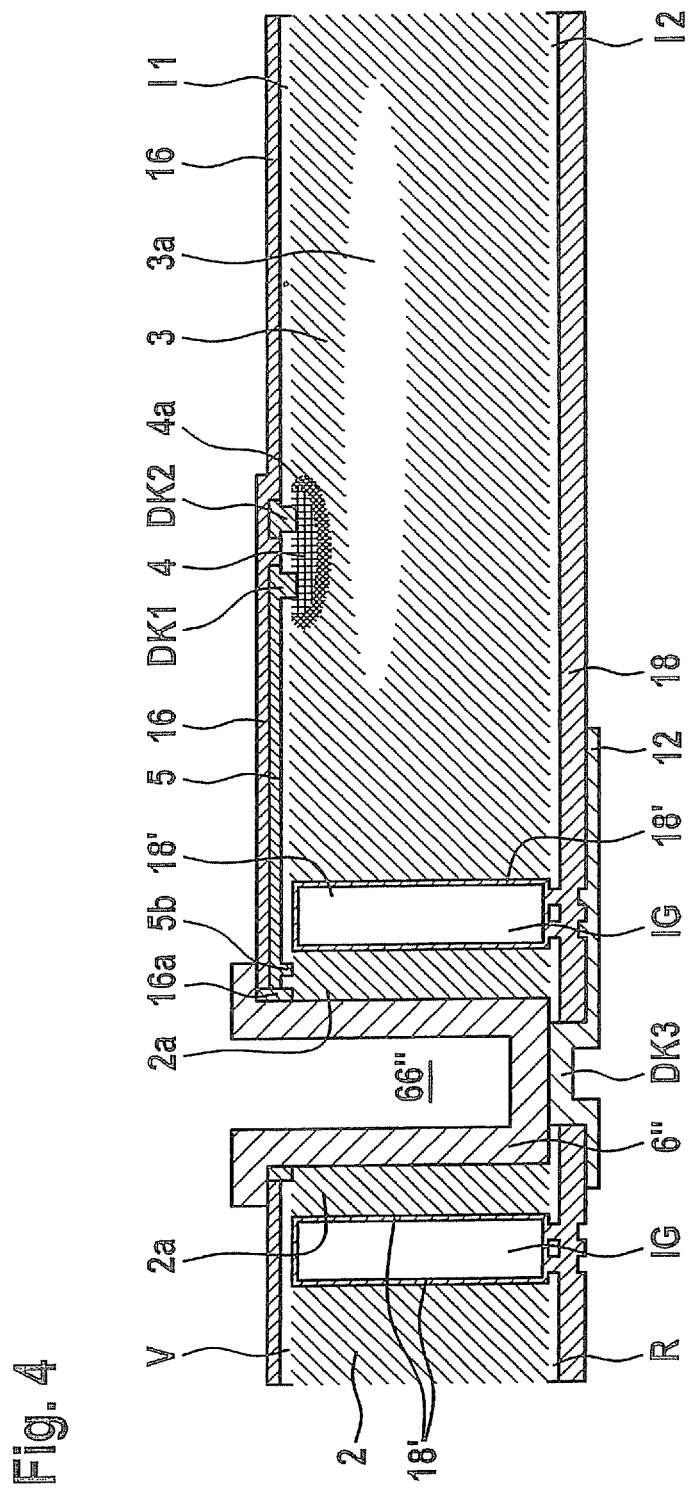
FIG. 4 shows a schematic cross-sectional illustration of a substrate having an electrical feedthrough according to a fourth specific embodiment of the present invention.

FIG. 4 shows a schematic cross-sectional illustration of a substrate having an electrical feedthrough according to a fourth specific embodiment of the present invention.

In the fourth specific embodiment according to FIG. 4, no contact ring 5a is provided via which electrical feedthrough 6" is contacted in parallel with corresponding cavity 66" and substrate region 2a; in contrast, in the fourth specific embodiment only substrate region 2a, which encloses electrical feedthrough 6", is contacted by a contact terminal 5b from printed conductor 5.

This type of indirect contacting is particularly suitable for applications which require high temperatures in the manufacturing process or in use, or which should be particularly robust with respect to applied corrosive media.

Printed conductor 5 and the metallic feedthrough may be separated by a protective layer 16a, it thus being possible to prevent phase formation between different metals. In addition, a diffusion barrier, made of Ti/TiN layers, for example, may be provided between electrical terminal region 5b and the substrate material, or between electrical feedthrough 6" and the substrate material.

Lastly, in this specific embodiment protective layer 16 does not extend above the top side of electrical feedthrough 6".

Otherwise, the fourth specific embodiment is identical to the first specific embodiment described above.

Figure 5:
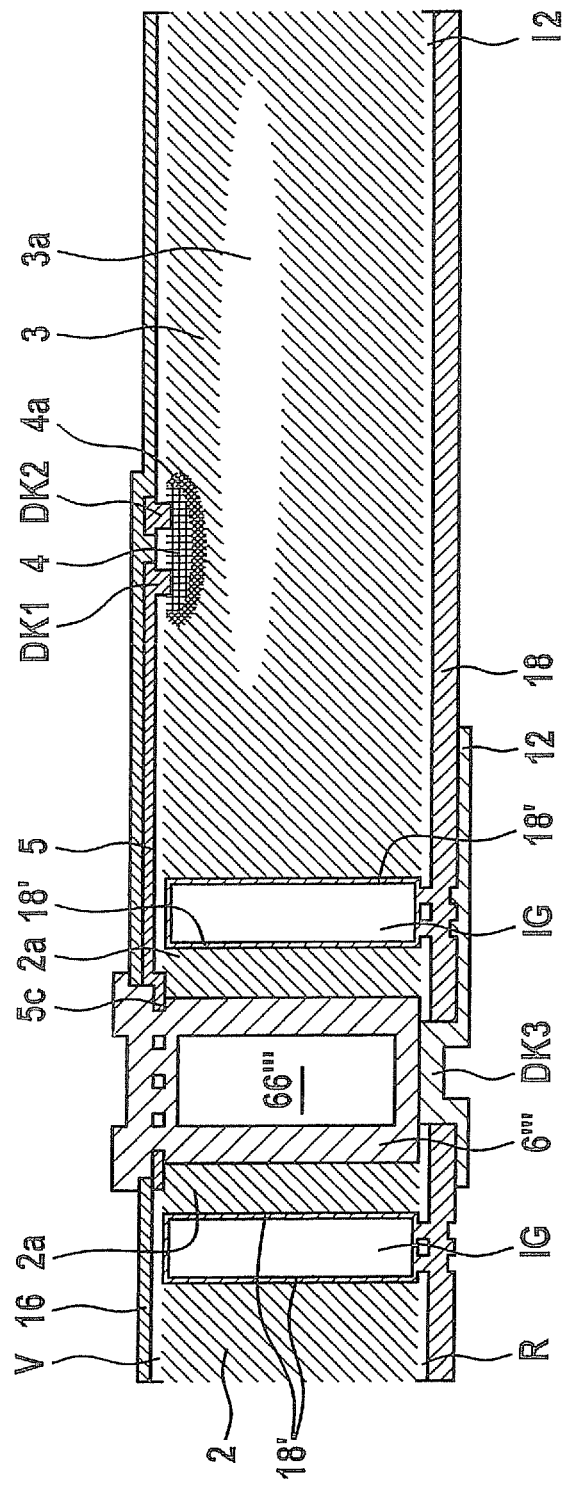
FIG. 5 shows a schematic cross-sectional illustration of a substrate having an electrical feedthrough according to a fifth specific embodiment of the present invention.

FIG. 5 shows a schematic cross-sectional illustration of a substrate having an electrical feedthrough according to a fifth specific embodiment of the present invention.

In the fifth specific embodiment according to FIG. 5, electrical feedthrough 6''' is likewise provided with a cavity 66''', but is closed off on the top side by metal, i.e., forms a closed hollow punch in a manner of speaking. Such a design may be achieved in that no contact ring 5a is formed as in the first specific embodiment, but, rather, a contact grid 5c is formed which is connected to printed conductor 5 and is closed off during the metal deposition.

Otherwise, the fifth specific embodiment is identical to the first specific embodiment described above.

Figure 6:
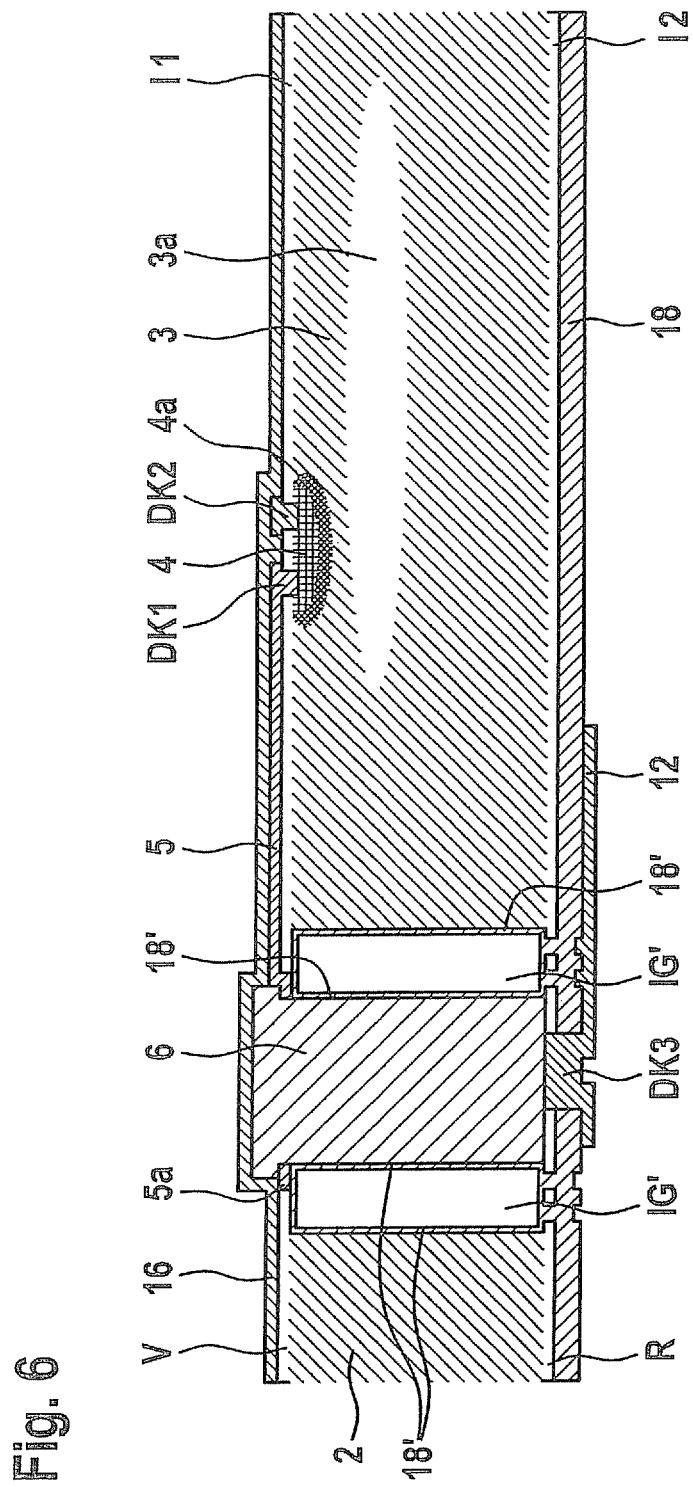
FIG. 6 shows a schematic cross-sectional illustration of a substrate having an electrical feedthrough according to a sixth specific embodiment of the present invention.

FIG. 6 shows a schematic cross-sectional illustration of a substrate having an electrical feedthrough according to a sixth specific embodiment of the present invention.

In the sixth specific embodiment according to FIG. 6, substrate region 2a is dispensed with and annular isolation trench IG' directly adjoins electrical feedthrough 6. Such an embodiment is particularly recommended when the smallest possible feedthrough is to be produced.

Otherwise, the sixth specific embodiment is identical to the first specific embodiment described above.

Although the exemplary embodiments and/or exemplary methods of the present invention have been described with reference to multiple exemplary embodiments which may be combined with one another as desired, the exemplary embodiments and/or exemplary methods of the present invention are not limited thereto, and may be further modified in various ways.

In particular, the above-mentioned materials are only examples, and are not to be construed as limiting. In addition, the micromechanical components such as the pressure sensor, the printed conductors, and further electrical components, for example, may be produced in or on the substrate, either before or after producing the feedthroughs.

Of course, any desired additional protective, insulating, passivation, and diffusion barrier layers may be deposited to further increase the reliability.

In addition, the sequence in the production of the annular isolation trenches and the electrical feedthroughs may be interchanged.

It is also possible for the electrical feedthrough to not be annularly enclosed by a substrate region, but instead, to be only partially enclosed, for example asymmetrically, by a substrate region.

What is claimed is:

1. A method for producing an electrical feedthrough in a substrate, the method comprising:
forming the electrical feedthrough so that it extends through the substrate from a front side to a back side of the substrate;
forming a first insulating layer on the front side of the substrate;
forming an annular isolation trench in the substrate which encloses the electrical feedthrough, using an etching process starting from the back side of the substrate, wherein the etching process terminates at the first insulating layer; and
closing off the annular isolation trench in the substrate by forming a third insulating layer on the back side of the substrate;
wherein during the formation of the annular isolation trench in the substrate, an annular substrate region is left which directly encloses the electrical feedthrough, and
wherein before the electrical feedthrough is formed, a second insulating layer is formed on the back side of the substrate.

2. The method of claim 1, wherein an electrical contact terminal for the electrical feedthrough is formed on the back side of the substrate.

3. A method for producing an electrical feedthrough in a substrate, the method comprising:
forming the electrical feedthrough so that it extends through the substrate from a front side to a back side of the substrate;
forming a first insulating layer on the front side of the substrate;
forming an annular isolation trench in the substrate which encloses the electrical feedthrough, using an etching process starting from the back side of the substrate, wherein the etching process terminates at the first insulating layer; and
closing off the annular isolation trench in the substrate by forming a third insulating layer on the back side of the substrate;
wherein on the front side of the substrate, an electrical printed conductor is formed between the electrical feedthrough and a micromechanical component, and
wherein before the electrical feedthrough is formed, a second insulating layer is formed on the back side of the substrate.

4. The method of claim 1, wherein on the front side of the substrate, an electrical printed conductor is formed between the electrical feedthrough and a micromechanical component, and wherein the electrical printed conductor is brought into direct electrical contact with the annular substrate region.

5. The method of claim 1, wherein the second insulating layer is formed on the back side of the substrate before forming the electrical feedthrough, and a through hole is subsequently formed in the substrate using an etching process, starting from the front side of the substrate, wherein the etching process terminates at the second insulating layer, and wherein the electrical feedthrough is subsequently formed by at least partially filling the through hole.

6. A method for producing an electrical feedthrough in a substrate, the method comprising:
forming the electrical feedthrough so that it extends through the substrate from a front side to a back side of the substrate;
forming a first insulating layer on the front side of the substrate;
forming an annular isolation trench in the substrate which encloses the electrical feedthrough, using an etching process starting from the back side of the substrate, wherein the etching process terminates at the first insulating layer; and
closing off the annular isolation trench in the substrate by forming a third insulating layer on the back side of the substrate;
wherein before the electrical feedthrough is formed, a blind hole is formed in the substrate by an etching process, starting from the front side of the substrate, wherein the electrical feedthrough is subsequently formed by at least partially filling the blind hole, and wherein the substrate is subsequently thinned on the back side until the electrical feedthrough is exposed on the back side, and
wherein a second insulating layer is formed on the back side of the substrate.

7. The method of claim 6, wherein before the electrical feedthrough is formed, the second insulating layer is formed on the back side of the substrate.

8. The method of claim 1, wherein before the electrical feedthrough is formed, a blind hole is formed in the substrate by an etching process, starting from the front side of the substrate.

9. The method of claim 1, wherein before the electrical feedthrough is formed, a blind hole is formed in the substrate by an etching process, starting from the front side of the substrate, and wherein the electrical feedthrough is subsequently formed by at least partially filling the blind hole.

10. The method of claim 1, wherein before the electrical feedthrough is formed, a blind hole is formed in the substrate by an etching process, starting from the front side of the substrate, wherein the electrical feedthrough is subsequently formed by at least partially filling the blind hole, and wherein the substrate is subsequently thinned on the back side until the electrical feedthrough is exposed on the back side.

11. The method of claim 3, wherein before the electrical feedthrough is formed, a blind hole is formed in the substrate by an etching process, starting from the front side of the substrate.

12. The method of claim 3, wherein before the electrical feedthrough is formed, a blind hole is formed in the substrate by an etching process, starting from the front side of the substrate, and wherein the electrical feedthrough is subsequently formed by at least partially filling the blind hole.

13. The method of claim 3, wherein before the electrical feedthrough is formed, a blind hole is formed in the substrate by an etching process, starting from the front side of the substrate, wherein the electrical feedthrough is subsequently formed by at least partially filling the blind hole, and wherein the substrate is subsequently thinned on the back side until the electrical feedthrough is exposed on the back side.

14. The method of claim 1, wherein a thin linear insulating liner layer is also formed on the walls of the annular isolation trench.

15. The method of claim 1, wherein a thin linear insulating liner layer is also formed on the walls of the annular isolation trench.

16. The method of claim 15, wherein the second insulating layer is formed on the back side of the substrate before forming the electrical feedthrough.

* * * * *